United States Patent [19]
Hasbun et al.

[11] Patent Number: 5,893,135
[45] Date of Patent: Apr. 6, 1999

[54] FLASH MEMORY ARRAY WITH TWO INTERFACES FOR RESPONDING TO RAS AND CAS SIGNALS

[75] Inventors: Robert N. Hasbun, Shingle Springs; Andrew H. Gafken, Folsom, both of Calif.

[73] Assignee: Intel Corporation, Santa Clara, Calif.

[21] Appl. No.: 587,799

[22] Filed: Dec. 27, 1995

[51] Int. Cl.$^6$ .............................. G06F 12/00; G06F 13/00
[52] U.S. Cl. ..................... 711/103; 365/120; 365/189.05; 365/222; 711/104
[58] Field of Search ........................ 364/DIG. 1, DIG. 2; 365/222, 120, 189.05, 189.03, 185.33, 185.08; 395/430, 438; 711/103, 104, 105, 111

[56] References Cited

U.S. PATENT DOCUMENTS

| | | | |
|---|---|---|---|
| 5,375,222 | 12/1994 | Robinson et al. | 395/425 |
| 5,379,401 | 1/1995 | Robinson et al. | 395/425 |
| 5,388,248 | 2/1995 | Robinson et al. | 395/425 |
| 5,406,529 | 4/1995 | Asano | 365/230.03 |
| 5,428,579 | 6/1995 | Robinson et al. | 365/230.03 |
| 5,432,927 | 7/1995 | Grote et al. | 395/575 |
| 5,463,757 | 10/1995 | Fandrich et al. | 395/430 |
| 5,509,134 | 4/1996 | Fandrich et al. | 395/430 |
| 5,526,506 | 6/1996 | Hyatt | 395/438 |
| 5,530,828 | 6/1996 | Kaki | 395/430 |
| 5,535,357 | 7/1996 | Moran et al. | 395/430 |
| 5,561,384 | 10/1996 | Reents et al. | 327/108 |
| 5,566,314 | 10/1996 | DeMarco et al. | 395/430 |
| 5,568,626 | 10/1996 | Takizawa | 395/430 |
| 5,581,726 | 12/1996 | Tanaka | 395/461 |
| 5,592,669 | 1/1997 | Robinson et al. | 395/622 |
| 5,619,452 | 4/1997 | Miyauchi | 711/103 |
| 5,644,539 | 7/1997 | Yamagami et al. | 711/103 |
| 5,650,967 | 7/1997 | Seibert | 365/185.33 |
| 5,651,128 | 7/1997 | Gaultier | 711/103 |

*Primary Examiner*—Tod R. Swann
*Assistant Examiner*—Tuan V. Thai
*Attorney, Agent, or Firm*—Blakely, Sokoloff, Taylor & Zafman LLP

[57] ABSTRACT

An arrangement for accessing a non-volatile memory array including providing a signal having a first condition if an access is a read and a second condition if an access is for any other operation; reading data directly from an address in the non-volatile memory array if the signal is a first condition; and performing any other access of the non-volatile memory array utilizing a command-centric interface if the signal is a second condition.

19 Claims, 5 Drawing Sheets

FLASH MEMORY ARRAY WITH TWO INTERFACES FOR RESPONDING TO RAS AND CAS SIGNALS

BACKGROUND OF THE INVENTION

1. Field of the Invention

This invention relates to computer systems and, more particularly, to methods and apparatus for utilizing a flash EEPROM memory array as a supplement to main memory in a computer.

2. History of the Prior Art

Recently, flash electrically-erasable programmable read-only memory (EEPROM) storage devices have been used in arrays as a new form of long term storage. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. Such memory transistors may be programmed by storing a charge on the floating gate. This charge remains when power is removed from the array. This charge (typically, a "zero" or programmed condition) or its absence (a "one" or erased condition) may be detected when the device is read.

These arrays may be designed to accomplish many of the operations previously accomplished by other forms of memory in digital systems and especially in computer systems. For example, flash memory is being used to replace various read-only memories (ROM) such as the basic input/output startup (BIOS) memory of a computer system. The ability to program flash memory in place offers substantial advantages for BIOS memory over more conventional EPROM memory which must be removed from the system to be reprogrammed for changes to system components. More recently, flash memory has been used to provide a smaller lighter functional equivalent of an electro-mechanical hard disk drive. Flash memory is useful for this purpose because it may be read more rapidly and is not as sensitive to physical damage as an electro-mechanical hard disk drive. Flash hard drive memories are especially useful in portable computers where space is at a premium and weight is extremely important.

Although flash EEPROM memory arrays have been used for ROM type storage and to replace electromechanical hard disk drives, they have not been successfully adapted to use on the memory bus for storing changing data.

There are a number of reasons that it is desirable to use flash EEPROM or other non-volatile memory arrays to supplement main memory. Flash and other non-volatile memory requires no refresh cycle and do not expend power or time on such cycles. A non-volatile memory on the memory bus would allow programs stored therein to be retained when power was removed from the system. Such programs would be available for execution when power was applied without having to be copied to memory. The system BIOS could be stored in and executed from such memory to provide much faster start ups and to eliminate the need for main memory DRAM to shadow the BIOS. Application programs and other processes could also be stored in and executed directly from the non-volatile memory array. To do so would eliminate the transfer of those application programs between long term memory and main memory and thereby relieve most of the page swapping and attendant loss of speed caused by congestion in the limited space available in DRAM main memory. It would also allow applications to begin running more rapidly when they were called.

It would seem simple to place flash memory storing an application program on the memory bus. However, all known prior art flash EEPROM memory arrays which store changing data have been designed to utilize what is referred to as a "command-centric interface." Such an interface is specifically designed to require a command to place the flash memory array into a particular mode before any command may be executed.

Typically the command-centric interface includes a control center which receives commands from a host and runs the necessary processes to access the flash media as dictated by the command. Thus, for example, when the host processor directs a write command to a flash EEPROM memory array and furnishes data and an address, the control center stores the command and starts a sequence of processes to first determine if the array is in the proper state to receive the command. The control center is typically able to execute a number of commands such as "read," "write," "erase," and "provide status." Because of the number of individual operations which are carried out to accomplish any of these commands, a command is executed only if the flash EEPROM memory array is in a mode in which a commanded operation is allowed. A write to an address in a block being erased cannot be processed, for example; and an error signal will be returned. On the other hand, when the flash EEPROM memory array is in a proper state, the control center causes the data furnished with a write command to be written to the specified address. Such an interface was designed to automate the very complicated processes of writing and erasing the flash media, processes which often affect large amounts of data. These processes are typically conducted by state machines under control of the control center. All other commands directed to a flash EEPROM memory array including read commands are similarly handled. In one flash EEPROM memory array, if a read command is directed to an array functioning in an incorrect mode to carry out the command, the array automatically provides status data.

In order to execute processes out of memory on the memory bus, memory must immediately respond whenever a read access is attempted by providing the addressed data to the processor. To assure that this is accomplished, DRAM main memory on the memory bus is adapted to respond immediately to a row address strobe (RAS) followed by a column address strobe (CAS) and output enable signals furnished by a memory controller to provide the data on the memory bus from an address provided by a host processor. Similarly, when a host processor writes to DRAM on the memory bus providing data and an address, the memory responds to row address strobe (RAS) and column address strobe (CAS) signals generated by the memory controller to store that data at the addressed position.

Even when flash memory is designed to be accessed as a row and column array so that it may be positioned on the memory bus, the command-centric interface eliminates the ability of the array to respond absolutely to a read command by providing the addressed data. The interface may provide the data if the mode is proper or instead provide status if the mode is improper. A memory controller is not equipped to deal with other than the read data so a status report would cause a system failure. It might be possible to place circuitry between the memory bus and the command centric interface which would cause the interface to automatically respond to a read which produced a status result by completing any running operations within the flash memory, shifting the mode of the flash memory to read, and then furnishing the read data on the memory bus. However, although such circuitry would produce the addressed data in response to a read, it could not possibly do so in a time frame which would allow the processor to function without an inordinate number of wait states.

In addition to its command-centric interface, a flash EEPROM memory array inherently responds more slowly to write operations. The level of charge required to write a flash device is quite high so that writing even to unused flash memory takes somewhat longer than writing to DRAM. Moreover, that time to write a flash EEPROM memory array is further increased because with such arrays modified information is written to a clean memory area rather than being written over old data; and the old data is marked as invalid. Because changed data may not be directly written over invalid data in a block of flash memory but must be written to an unused area, the old data invalidated, and the block with invalid data ultimately erased, the average time to write to flash memory is increased by this erase time.

Thus a flash EEPROM memory array cannot be guaranteed to respond to operations at a rate or with a result which will allow its use on the memory bus to store processes which may be directly executed from that flash memory.

It is desirable to be able to utilize flash memory to supplement main memory in a computer system by providing an interface which allows flash memory to respond rapidly to read operations on the memory bus while still protecting data stored.

SUMMARY OF THE INVENTION

It is, therefore, an object of the present invention to provide apparatus and a method for utilizing non-volatile memory arrays positioned on the memory bus of a computer to store programs and processes which may be executed from the flash memory.

This and other objects of the present invention are realized by apparatus and a method including circuitry for causing a non-volatile memory to respond immediately and automatically to carry out read operations without waiting for a command to place the memory in a read state and to respond to other commands through a standard command-centric interface. This is accomplished in one embodiment by providing a bifurcated interface which allows a non-volatile memory to utilize a first direct path in response to RAS before CAS control signals to immediately access the memory for reading at row and column addresses furnished on the address bus and to utilize a second path through a command interface in response to CAS before RAS control signals for all other operations.

These and other objects and features of the invention will be better understood by reference to the detailed description which follows taken together with the drawings in which like elements are referred to by like designations throughout the several views.

BRIEF DESCRIPTION OF THE INVENTION

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

In this specification, a signal which includes a "#" in its name is considered to be an active low signal. The term "assert" as applied to a signal indicates that signal is active independent of whether the level of the signal is low or high. The term "de-assert" indicates that a signal is inactive.

DETAILED DESCRIPTION

Figure 1:
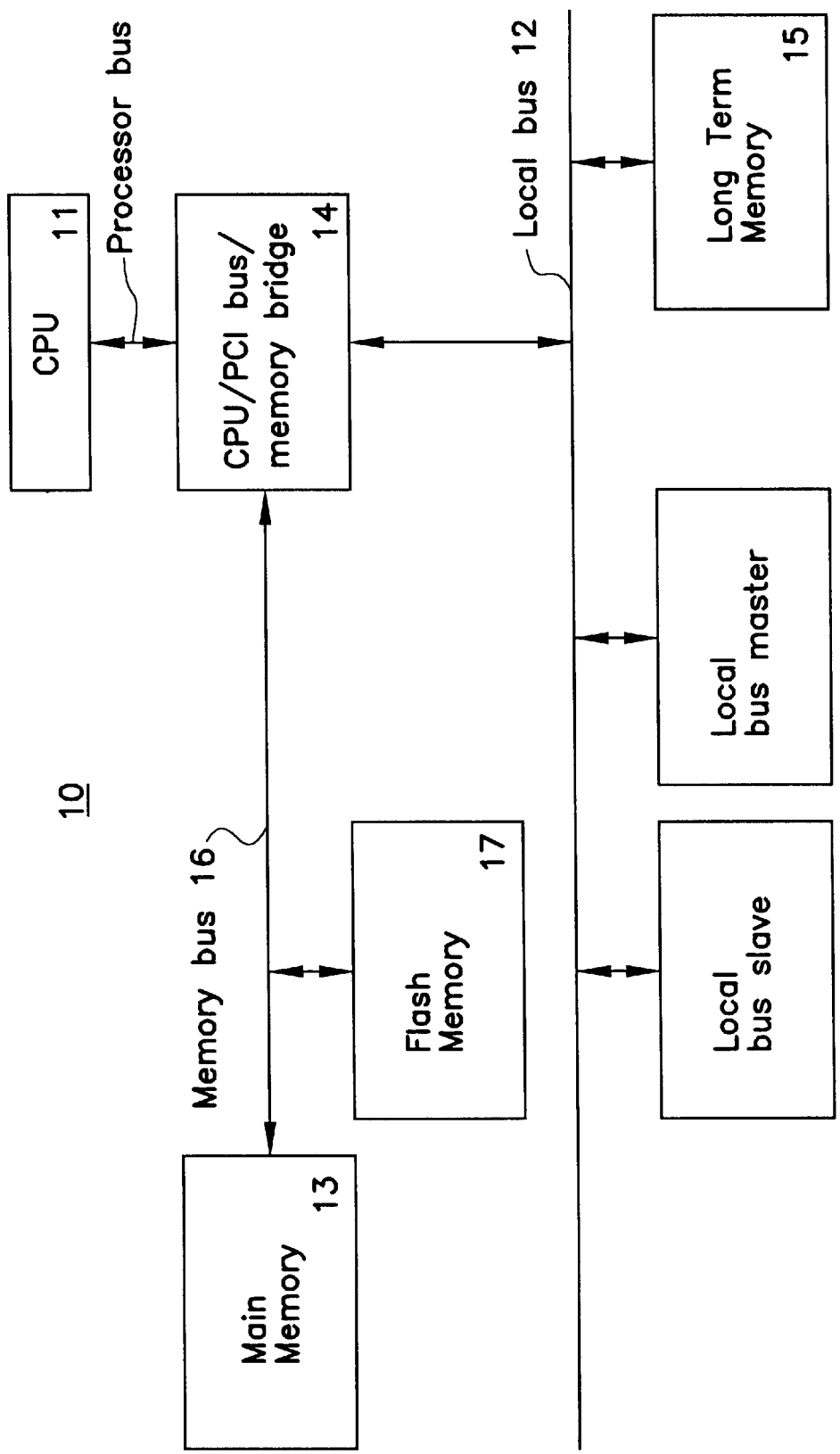
FIG. 1 is a block diagram of a computer system designed in accordance with the present invention.

Referring now to FIG. 1, there is illustrated a computer system 10 configured in accordance with one embodiment of the present invention. The system 10 illustrated includes a central processing unit 11 which executes the various instructions provided to control the operations of the system 10. The central processing unit 11 is typically joined by a processor bus to a bridge circuit 14 which controls access to an input/output bus 12 adapted to carry information between the various components of the system 10. In FIG. 1, the bus 12 is preferably a peripheral component interface (PCI) bus or other local bus adapted to provide especially fast transfers of data. This bus is chosen in FIG. 1 for illustrative purposes only. In a typical system 10, various input/output devices are connected to the bus 12 as bus master and bus slave circuits. In the present illustration, for example, long term memory 15 may be joined to the PCI bus 12 as a bus slave circuit. Other input/output devices such as sound boards, frame buffers, and the like may also be joined to the bus 12.

The bridge circuit 14 is also joined by a memory bus 16 to main memory 13. Main memory 13 is typically constructed of dynamic random access memory (DRAM) arranged in a manner well known to those skilled in the prior art to store information during a period in which power is provided to the system 10. In the present invention, a flash EEPROM memory array or other non-volatile memory 17 designed in accordance with the present invention is also positioned on the memory bus 16 to supplement main memory 13.

Additional components may be joined to the system 10 through additional bridge circuits joined to the bus 12. In many systems, such a local bus-to-secondary bus bridge joins a bus such as an Industry Standard Association (ISA) bus or an Extended Industry Standard Association (EISA) bus to the system so that components adapted to be used with those buses may be utilized. In a typical Intel-processor-based personal computer, read only memory which stores the BIOS processes is joined to such a secondary bus through what is referred to as an "X bus."

Figure 2:
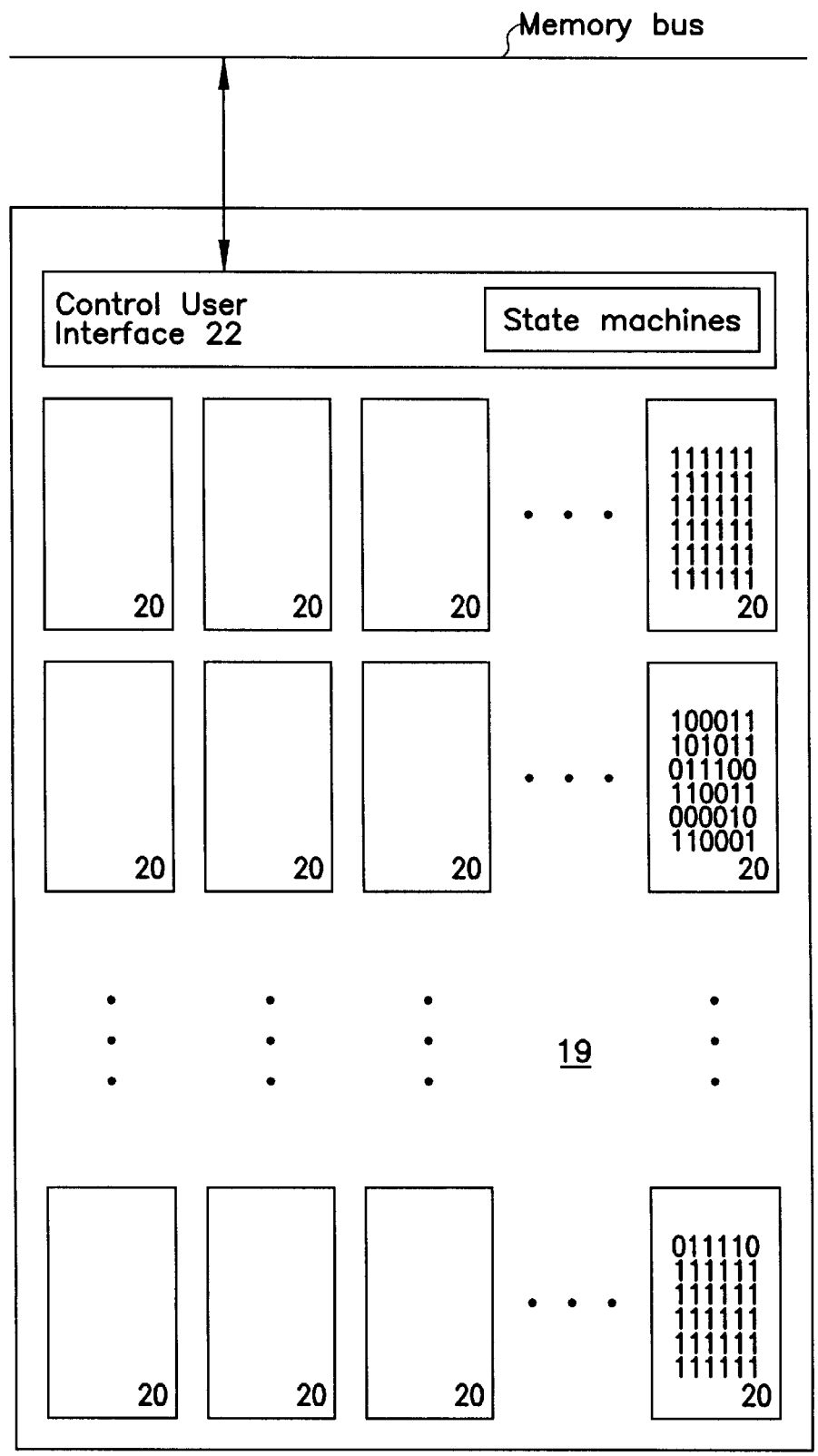
FIG. 2 is a block diagram of a typical flash EEPROM memory array designed in accordance with the prior art.

FIG. 2 is a block diagram of a prior art flash EEPROM memory array 19. The flash EEPROM memory array 19 is divided into a number of blocks 20 each of which may be independently erased. Each of these blocks 20 includes flash memory devices joined in logical row and column arrangement. Any particular device is accessed by selecting its row and column in the manner in which data is accessed in dynamic random access memory (DRAM).

Flash memory typically utilizes a command-centric interface 22 (also referred to as a command user interface) which controls the accessing of the array. The command user interface 22 is comprised of control circuitry adapted to receive commands from a host and carry out the commands using hardware such as state machines. When a flash EEPROM memory array receives a command, the command user interface 22 typically stores the command and checks whether the mode of operation of the array is proper for the commanded access. If the array is in the proper mode, the command user interface 22 executes the command. If the array is not in the proper mode, the interface carries out one or more processes which terminate the present operating mode and place the array in the proper mode to execute the command. Only then may data be read from or written to the array.

When a program is to be executed, it is necessary that each step of the program be available to the central processing unit as needed. This means that if a program is to be executed from memory on the memory bus, that memory must immediately provide the addressed data in response to a read command. Memory cannot respond to a read by providing something other than the addressed data or a system failure will occur. Memory cannot delay so long in providing the data that wait states must be inserted in the processor operations or the operation of the entire computer will be slowed. For this reason, memory on the memory bus must be able to respond to read commands with the addressed data without any delay.

Figure 3:
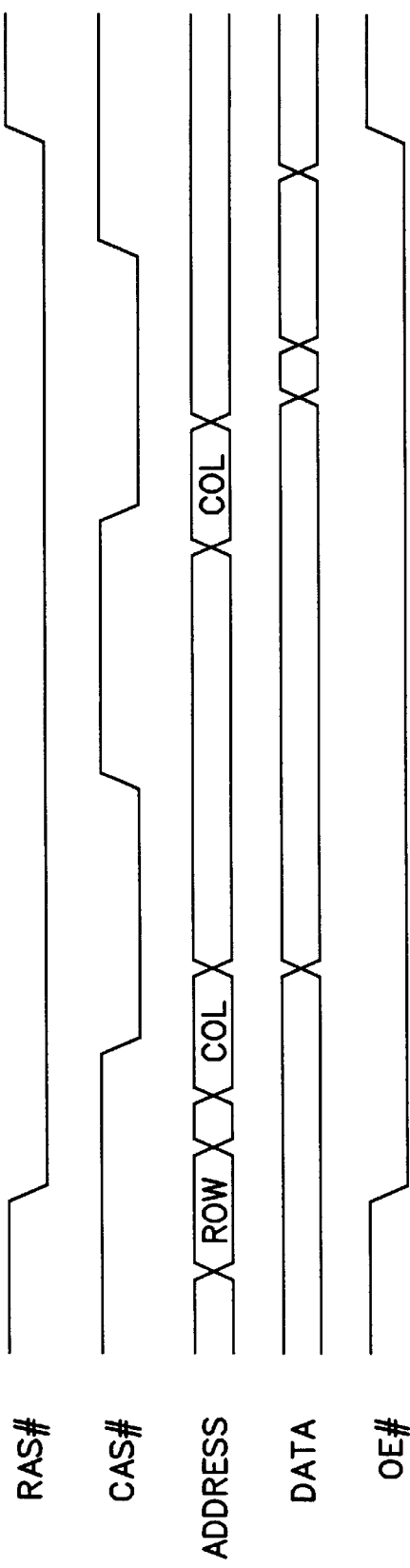
FIG. 3 is a timing diagram illustrating a conventional DRAM main memory responding to commands for reading and writing data.

DRAM main memory is designed to provide data immediately in response to a read. DRAM main memory is joined to the memory bus through a standard DRAM interface which allows rapid response to commands. FIG. 3 is a timing diagram illustrating the operation of a conventional DRAM memory array in response to commands for reading or writing data on the memory bus. As may be seen, a row address is asserted on the address lines. A normal DRAM read or write cycle initiated by a host with an address assertion causes a memory controller (which is part of the bridge circuit 14 of FIG. 1) to assert a RAS# signal followed by one or more assertions of a CAS# signal. When the RAS# signal is asserted, the addressed row is selected. When a CAS# signal is asserted, the column address asserted on the address lines is selected. If the operation is a read, an output enable signal OE# is asserted during the period in which the column address is asserted. This causes the addressed data to be placed on the memory bus. So long as the output enable signal and the row address strobe signal remain asserted, additional column addresses may be asserted and the data at those addresses read. If the operation is a write, the output enable signal is not asserted; and the data placed on the memory bus by the host is written to the selected address in DRAM.

Figure 4:
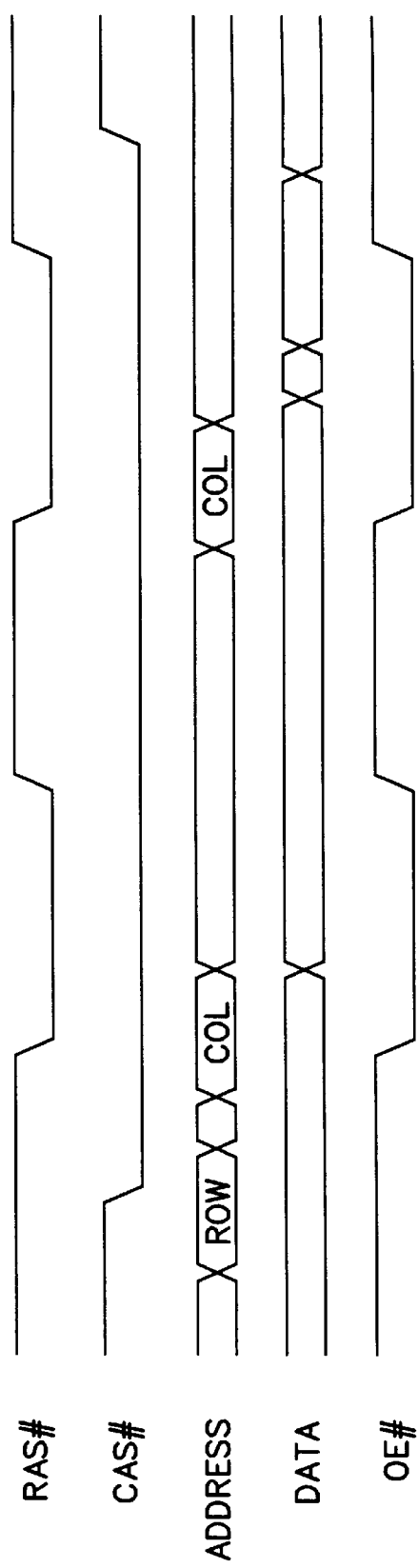
FIG. 4 is a timing diagram illustrating a conventional DRAM memory array responding to commands causing a refresh sequence.

Of interest is the standard DRAM refresh sequence illustrated in the timing diagram of FIG. 4. Such a sequence is initiated when a column address strobe is asserted before a row address strobe. As may be seen, a row address is asserted on the address lines. When the CAS# signal is asserted, this addressed row is selected since the routing of the RAS# and CAS# signals are reversed when the CAS# signal is received first. It will be understood by those skilled in the art that the memory array is provided with address translating circuitry which is well known to cause the CAS# signal to be used to select a row and the RAS# signal to be used to select columns when the strobe signals are furnished in this sequence. The column address is then asserted on the address lines. When a PAS# signal is asserted, this addressed column is selected. During each period in which the RAS# signal is asserted, an output enable signal OE# is also asserted. This causes the addressed data to be read from each addressed column of memory cells and used to refresh the cells from which the data is read. During refresh operations additional column addresses may be asserted as is shown in the Figure.

Although attempts have been made to place flash memory arrays on the memory bus, all known flash memory arrays which store changing data have been designed to utilize a command-centric interface to automate the processes of writing and erasing the array. Although such an interface is useful in assisting the programming of the complicated processes required to accomplish writing and erasing of flash memory, the command-centric interface as designed eliminates the ability to guarantee that addressed data will be provided in response to a read and instead guarantees system failure. If modified to include circuitry to provide this guarantee, the array would be much too slow to be used on the memory bus without slowing processor operations; a read cannot wait for a determination of the operational mode of the array before furnishing data for use by the processor in program execution.

The attempt to place command-centric flash memory arrays on the memory bus has been further complicated by the fact that flash memory arrays are not written in the same manner as DRAM or other memory. When DRAM or a form of magnetic memory is written, the states of all of the bits being written change essentially together. When a word or byte of flash memory is written or erased, the current required to charge or discharge the floating gates is much higher, so the devices take longer to change state. This makes writing to a flash memory array quite slow compared to writing to the typical DRAM memory used for main memory. For this reason, flash memory positioned on the memory bus has been considered to be unsuitable for storing programs and processes which involve frequent write operations.

However, even though the read and write times are long compared to similar times for DRAM, there are a number of reasons to use non-volatile memory arrays to supplement main memory. One primary reason for doing so is to place the BIOS processes on the memory bus. To do so would allow faster machine turn on, would eliminate the need to provide space in DRAM main memory for shadowing the BIOS processes, and could help eliminate the need for secondary buses such as the ISA and EISA buses. Another reason for supplementing DRAM main memory with flash memory arrays is to store application programs in flash on the memory bus. This would eliminate the need to transfer application programs between long term memory and main memory before use and thereby relieve the page swapping and attendant loss of speed caused by congestion in the limited space available in main memory. If a non-volatile memory array could be positioned on the memory bus and accessed as rapidly as the main memory DRAM, application programs could be placed in and made executable from the non-volatile memory arrays and would not need to be called from long term memory and placed in main memory in order to run. The main memory page swapping typically needed to run large applications could be essentially eliminated as to applications stored in the flash memory. All of the processes of any such application program would be available in non-volatile memory array, and the processor would not have to spend the time with these housekeeping functions.

The present invention allows application programs and processes to be stored in a flash EEPROM or other non-volatile memory array positioned on the memory bus of a computer system and executed from the flash memory array. This is accomplished in the present invention by providing an interface which allows read operations to be separated from the command-centric interface operations so that the array may respond to read requests on the memory bus at a speed equivalent to DRAM memory. The present invention maintains the command-centric interface for any other operations which might be necessary in the flash array such as rewriting a new version of a program; thus the writing and erasing of the array continue to be automated. The speed provided by using this arrangement allows execution of programs from a non-volatile memory array with its attendant benefits.

One embodiment of the present invention allows a flash EEPROM memory array normally utilizing a command-centric interface to respond to RAS and CAS and output enable signals initiated by the memory controller in response to a host read command by immediately conducting read operations and placing the results on the memory bus without waiting for any command to appear which requires determination of array status.

This allows the DRAM interface control signals generated by the memory controller and illustrated in FIGS. 3 and 4 to be used in accordance with the present invention for accessing a flash EEPROM memory array.

The DRAM portion of main memory responds to control signals in the manner illustrated in FIGS. 3 and 4 which signals are provided by the memory bus control circuitry whenever an operation is conducted by the host processor on the memory bus. In accordance with the invention, the flash EEPROM memory array is similarly made to respond to a control signal sequence provided by the memory controller in which the RAS# signal is asserted followed by any CAS# signal and an output enable signal by functioning in the array read state without the need for any additional command or testing of array mode. In this array read state, the flash EEPROM memory array responds to row and column addresses for accessing its assigned memory addresses by immediately accessing the addressed rows and columns and providing the data at those addresses on the memory bus. In one embodiment of the invention, this state of the array is read only. A second embodiment which allows write operations is discussed below.

Similarly, the flash EEPROM memory array is made to respond to a control signal sequence provided by the memory controller in which the CAS# signal is asserted before any RAS# signal by responding in the command interface state. Thus, during such periods, various commands may be directed to the flash EEPROM memory array; and the command-centric interface will respond in its normal fashion to those commands.

Figure 5:
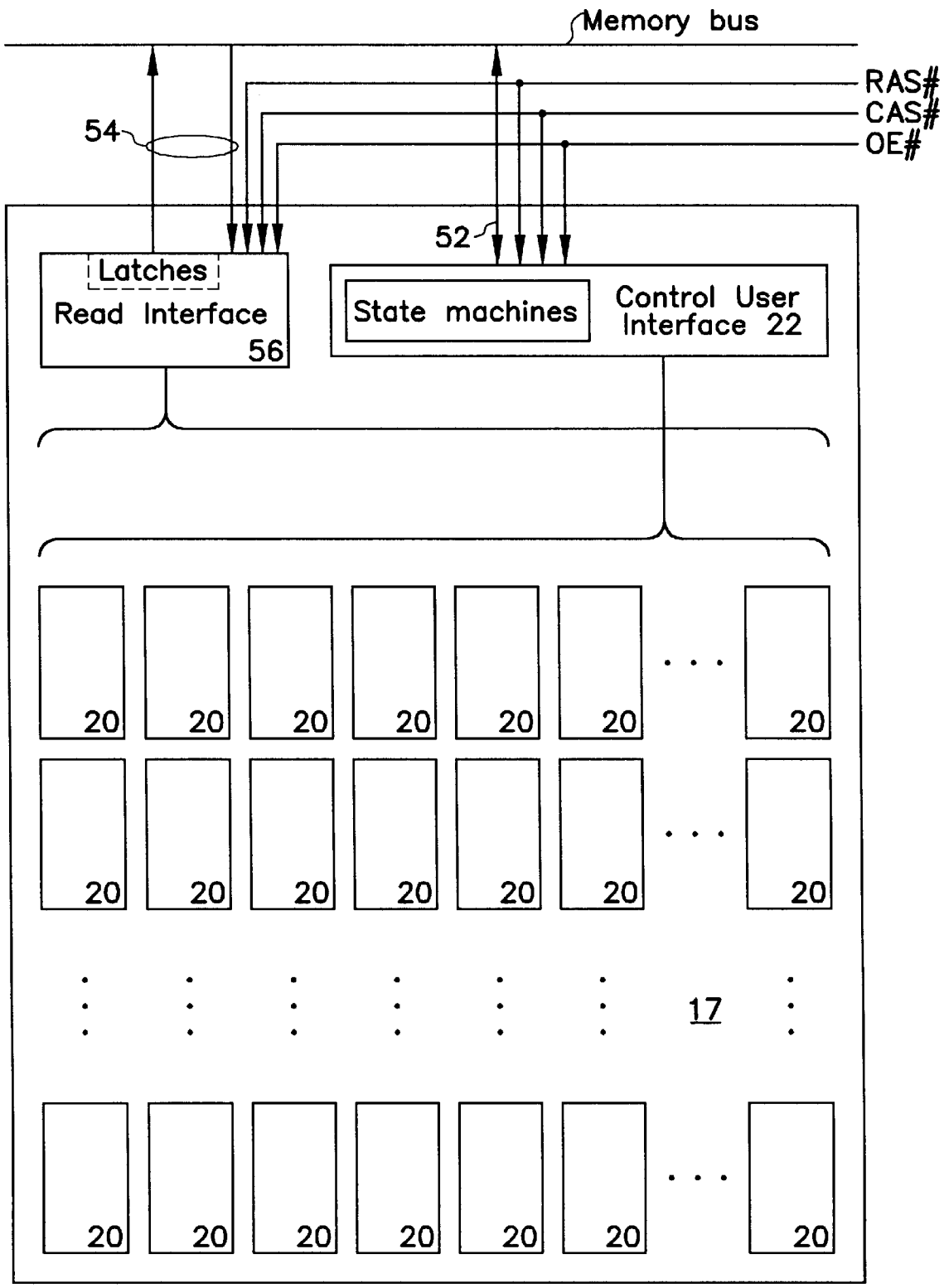
FIG. 5 is a block diagram of a flash EEPROM memory array designed in accordance with the present invention.

FIG. 5 is a block diagram illustrating one embodiment of a flash EEPROM memory array 17 designed in accordance with the present invention. In contrast to the flash EEPROM memory array of FIG. 2, the array 17 includes two separate paths to the memory bus. A first path 52 is the same as the normal path of the flash EEPROM memory array of FIG. 2 and utilizes all of the assets of the command user interface 22. The second path 54 bypasses the command user interface completely and connects directly to a read interface 56. The read interface 56 includes circuitry adapted in a manner well known to those skilled in the art to read data stored in the array.

In the embodiment illustrated, the command user interface 22 and the read interface 56 both receive the RAS# and CAS# control signals. If the CAS# signal appears first, the command user interface is selected; and the flash EEPROM memory array waits for commands before performing any operations. In this state, the flash EEPPOM memory array may respond to any operations the command user interface is capable of conducting to, for example, write, erase, and provide status. If the RAS# signal appears first followed by a CAS# signal and accompanied by an output enable, the read interface 54 (instead of the command user interface 22) responds to the addresses provided by reading the data addressed and providing that data on the memory bus.

Since the use of these CAS# and RAS# signals affects only the path used by the operation between the flash EEPROM memory array and the memory bus, the command user interface may continue any operations it is conducting which do not affect that portion of the flash EEPROM memory array addressed. This allows the flash EEPROM memory array to be utilized in systems running multi-threaded operating systems.

As explained, the circuitry of the array 17 may be made to respond directly to the RAS# and CAS# signals in the manner described to select the two different paths 52 and 54 to the command user interface and the read interface 56, respectively. Alternatively, switching circuitry such as multiplexing circuitry might be provided which responds to the order of these signals to switch the input to one or the other of the two paths. It would also be possible to modify the circuitry of the command user interface to provide a direct path for the read operation within the command user interface itself so that less circuitry would need to be duplicated.

Figure 6:
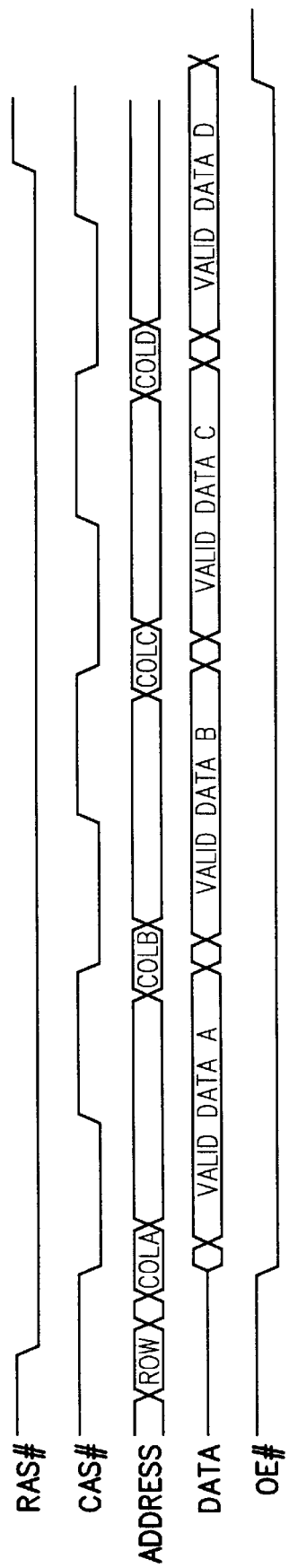
FIG. 6 is a timing diagram illustrating one mode of operation of one embodiment of a flash EEPROM memory array used as a supplement to main memory.

In an advanced embodiment of the invention, the flash EEPROM memory array may be made to respond to burst read operations in the same manner as extended data out (EDO) DRAM. FIG. 6 is a timing diagram which illustrates the operation of EDO DRAM. As may be seen, the timing of the signals is such that the data read is maintained on the memory bus after each of the CAS# signals is deasserted. This is accomplished by latching the data which has been read. Maintaining the data on the memory bus allows precharge time for the CAS# signals to pass without the bus transitioning so that read time is reduced.

The flash EEPROM memory array of FIG. 5 may be made to operate in the manner described by the timing diagram of FIG. 6 by providing latching (such as D latches) at the read output terminals.

Another embodiment of the invention would allow writing to the flash EEPROM memory array utilizing the same control signals for selecting the operation. By placing a DRAM buffer at the input to the second path 54 to store data being written and adding circuitry to the second path for enabling the write processes of the command user interface, the flash EFPROM memory array could respond to a RAS# before CAS# sequence furnished by the memory controller to write data to the buffer and signal the command user interface that the data is available for writing at its leisure.

Although the RAS and CAS signals used by memory controllers for reading DRAM memory are described herein, other methods for selecting read and other operations in a flash memory without utilizing the typical command-centric interface will be apparent to those skilled in the art who become familiar with the teachings of this specification. For example, an additional input terminal on a flash EEPROM memory array might be utilized to carry a control signal which in one condition selects a direct path for reading the array and in another condition selects a command-centric interface for processing commands to the array.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A memory for coupling to a memory bus coupled to a processor, said memory bus for transmitting row address strobe (RAS) and column address strobe (CAS) signals otherwise used to access dynamic random access memory (DRAM) said memory comprising:
   a plurality of flash memory cells; and
   a command-centric and a non-command centric interface each coupled to receive RAS and CAS signals from said memory bus, wherein said command-centric interface includes a state machine that must be switched between different ones of a plurality of states to perform different commands, wherein said non-command centric interface is always in a read state, wherein selection between said command centric and said non-command-centric interfaces is based on the order of the RAS and CAS signals, and wherein said command-centric interface is used to access said plurality of flash memory cells for memory writes and said non-command-centric interface provides a direct path to said plurality of flash memory cells for memory reads.

2. The memory of claim 1, wherein said non-command-centric interface supports burst reads.

3. The memory of claim 1, wherein selection between said command-centric and said non-command-centric interfaces is also based on an output enable signal.

4. The memory of claim 3, wherein said command-centric interface includes a DRAM buffer for memory writes.

5. A computer system that operates main memory using row address strobe (RAS) and column address strobe (CAS) signals said computer system comprising:
   a processor;
   a memory controller to generate RAS and CAS signals; and
   a flash memory module having a command-centric and a non-command-centric interface each coupled to receive the RAS and CAS signals, wherein said command-centric interface includes a state machine that must be switched between different ones of a plurality of states to perform different commands, wherein said non-command centric interface is always in a read state, wherein selection between said command-centric and said non-command-centric interfaces is based on the order of the RAS and CAS signals, and wherein said command-centric interface is used for memory writes and said non-command-centric interface provides a direct path for memory reads.

6. The computer system of claim 5, wherein selection between said command-centric and said non-command-centric interfaces is also based on an output enable signal.

7. The computer system of claim 6, wherein said command-centric interface includes a DRAM buffer for memory writes.

8. A method of operating a flash memory array responsive to row address strobe (RAS) and column address strobe (CAS) signals otherwise used to operate dynamic random access memory (DRAM), said method comprising the computer-implemented steps of:
   receiving a first and second set of RAS and CAS signals at both a command-centric interface and a non-command centric interface of said flash memory array, wherein the RAS and CAS signals are received in a different order in said first and second sets of signals, and wherein said first set of signals is for a read operation, wherein said command-centric interface includes a state machine that must be switched between different ones of a plurality of states to perform different commands, and wherein said non-command centric interface is always in a read state;
   selecting for each of said first and second sets of signals, between said command-centric and said non-command-centric interface based on the order in which the RAS and CAS signals were received, and wherein said non-command-centric interface is selected for said first set of signals;
   performing the operations for the first and second sets of signals on the cells of said flash memory array.

9. A main memory module responsive to row address strobe (RAS) and column address strobe (CAS) signals otherwise used to operate dynamic random access memory (DRAM), said main memory module comprising:
   a plurality of flash memory cells;
   a direct interface and a command centric interface coupled to said plurality of flash memory cells, and for coupling to receive RAS and CAS signals typically used to operate dynamic random access memory, wherein said command-centric interface includes a state machine that must be switched between different ones of a plurality of states to perform different commands, wherein said direct interface is always in a read state, said direct interface to perform read operations, said command-centric interface to perform write and erase operations.

10. The main memory module of claim 9, wherein said command-centric interface includes a memory faster than flash memory to buffer write operations.

11. The main memory of claim 9, wherein the RAS and CAS signals for both read and write operations are received in the same order and read and write operations are differentiated by an output enable signal.

12. The main memory of claim 9, wherein the command-centric interface is also selected when the RAS and CAS signals are received in the opposite order of that used for read and write operations.

13. A computer system that operates main memory using dynamic random access memory (DRAM), row address strobe (RAS) and column address strobe (CAS) signals, the computer system comprising:

a processor;

a memory controller coupled to the processor to generate the RAS and CAS signals to access main memory; and a flash memory array coupled to the memory controller to receive the DRAM, RAS and CAS signals, said flash memory array including a direct interface for read operations and a command-centric interface for other operations, both said direct interface and said command-centric interface receive the RAS and CAS signals, wherein said command-centric interface includes a state machine that must be switched between different ones of a plurality of states to perform different commands, and wherein said direct interface is always in a read state.

14. The computer system of claim 13, wherein said command-centric interface includes a memory faster than flash memory to buffer write operations.

15. The computer system of claim 13, wherein the RAS and CAS signals for both read and write operations are received in the same order and read and write operations are differentiated by an output enable signal.

16. The computer system of claim 13, wherein the command-centric interface is also selected when the RAS and CAS signals are received in the opposite order of that used for read and write operations.

17. A method of operating a flash memory array responsible to row address strobe (RAS) and column address strobe (CAS) signals otherwise used to operate dynamic random access memory, said method comprising the steps of:

generating RAS and CAS signals to cause main memory read and write operations;

satisfying the read operations from said flash memory array responsive to said signals using a direct interface that never requires a mode switch; and performing the write operations on said flash memory array responsive to said signals using a command-centric interface, wherein said command-centric interface includes a state machine that must be switched between different ones of a plurality of modes to perform different commands, and wherein both said direct interface and said command-centric interface are coupled to receive said signals.

18. The method of claim 17, wherein said step of generating RAS and CAS signals includes the steps of:

generating an output enable signal with RAS followed by CAS for the read operations; and generating an inverse of the output enable signal with RAS followed by CAS for the write operations.

19. The method of claim 17, wherein said step of performing the write operations includes the steps of:

buffering the write operations in a memory that is in the flash memory array and that is faster than the flash memory cells in the flash memory array.

* * * * *

UNITED STATES PATENT AND TRADEMARK OFFICE
CERTIFICATE OF CORRECTION

PATENT NO. : 5,893,135
DATED : April 6, 1999
INVENTOR(S) : Hasbun, et al.

It is certified that error appears in the above-identified patent and that said Letters Patent is hereby corrected as shown below:

In column 6 at line 27 delete "PAS#" and insert -- RAS# --

In column 8 at line 30 delete "EEPPOM" and insert

-- EEPROM --

Signed and Sealed this

First Day of February, 2000

Q. TODD DICKINSON

Attest:

*Attesting Officer*

*Acting Commissioner of Patents and Trademarks*